United States Patent
Ellis-Monaghan et al.

(10) Patent No.: US 9,240,463 B2
(45) Date of Patent: Jan. 19, 2016

(54) HIGH VOLTAGE LATERALLY DIFFUSED METAL OXIDE SEMICONDUCTOR

(71) Applicant: INTERNATIONAL BUSINESS MACHINES CORPORATION, Armonk, NY (US)

(72) Inventors: John J. Ellis-Monaghan, Grand Isle, VT (US); Theodore J. Letavic, Putnam Valley, NY (US); Santosh Sharma, Essex Junction, VT (US); Yun Shi, South Burlington, VT (US); Michael J. Zierak, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 278 days.

(21) Appl. No.: 13/902,245

(22) Filed: May 24, 2013

(65) Prior Publication Data

US 2014/0346596 A1    Nov. 27, 2014

(51) Int. Cl.
  *H01L 29/78* (2006.01)
  *H01L 29/66* (2006.01)

(52) U.S. Cl.
  CPC ...... *H01L 29/66681* (2013.01); *H01L 29/7816* (2013.01)

(58) Field of Classification Search
  CPC ............ H01L 29/0634; H01L 29/1095; H01L 29/404; H01L 29/0615
  See application file for complete search history.

(56) References Cited

U.S. PATENT DOCUMENTS

| | | | |
|---|---|---|---|
| 4,288,806 A | * | 9/1981 | Ronen ......................... 257/409 |
| 5,204,545 A | | 4/1993 | Terashima |
| 5,907,173 A | | 5/1999 | Kwon et al. |
| 6,307,232 B1 | | 10/2001 | Akiyama et al. |
| 6,310,378 B1 | | 10/2001 | Letavic et al. |
| 6,825,531 B1 | | 11/2004 | Mallikarjunaswamy |
| 6,879,005 B2 | | 4/2005 | Yamaguchi et al. |
| 7,525,178 B2 | | 4/2009 | Kulinsky |
| 7,535,057 B2 | | 5/2009 | Yang |
| 7,582,533 B2 | | 9/2009 | Ko |
| 7,608,513 B2 | | 10/2009 | Yang et al. |
| 7,768,071 B2 | | 8/2010 | Huang et al. |
| 7,776,700 B2 | | 8/2010 | Yang et al. |
| 7,824,968 B2 | | 11/2010 | Chu et al. |
| 7,910,991 B2 | | 3/2011 | Yang et al. |

(Continued)

FOREIGN PATENT DOCUMENTS

WO    2009109587 A1    9/2009

OTHER PUBLICATIONS

Z. Hossain et al, "Field-Plate Effects on the Breakdown Voltage of an Integrated High-Voltage LDMOS Transistor" The 16th International Symposium on Power Semiconductor Devices and ICs, pp. 237-240, 2004.

(Continued)

*Primary Examiner* — Thomas L Dickey
(74) *Attorney, Agent, or Firm* — Michael Le Strange; Andrew M. Calderon; Roberts Mlotkowski Safran & Cole, P.C.

(57) ABSTRACT

High-voltage LDMOS devices with voltage linearizing field plates and methods of manufacture are disclosed. The method includes forming an array of poly islands and a control gate structure by patterning a poly layer formed over a deep well region and a body of a substrate. The method further includes forming a metal shield in contact with the control gate structure and over the array of poly islands.

15 Claims, 6 Drawing Sheets

(56) References Cited

U.S. PATENT DOCUMENTS

| | | |
|---|---|---|
| 7,956,412 B2 | 6/2011 | Feilchenfeld et al. |
| 8,264,038 B2 | 9/2012 | Pendharkar et al. |
| 8,389,341 B2 | 3/2013 | Huang et al. |
| 2003/0038316 A1 | 2/2003 | Tsuchiko et al. |
| 2003/0173624 A1 | 9/2003 | Choi et al. |
| 2004/0140517 A1 | 7/2004 | Tsuchiko |
| 2004/0251499 A1 | 12/2004 | Yamaguchi et al. |
| 2007/0114608 A1 | 5/2007 | Letavic |
| 2008/0246086 A1 | 10/2008 | Korec et al. |
| 2009/0039424 A1* | 2/2009 | Su et al. ............ 257/339 |
| 2009/0096022 A1 | 4/2009 | Chang et al. |
| 2010/0025756 A1* | 2/2010 | Fu et al. ............ 257/328 |
| 2010/0052057 A1 | 3/2010 | Chung et al. |
| 2010/0065909 A1* | 3/2010 | Ichijo ............ 257/343 |
| 2011/0115017 A1 | 5/2011 | Alter et al. |
| 2011/0260247 A1 | 10/2011 | Yang et al. |
| 2011/0309442 A1* | 12/2011 | Grote et al. ............ 257/339 |
| 2012/0161230 A1 | 6/2012 | Satoh et al. |
| 2012/0228704 A1* | 9/2012 | Ju ............ 257/339 |
| 2012/0267715 A1 | 10/2012 | Chou et al. |
| 2013/0020632 A1 | 1/2013 | Disney |

OTHER PUBLICATIONS

"Floating Islands and Thick Bottom Oxide Trench Gate MOSFET (FITMOS) with Passive Hole Gate—60V Ultra Low On-Resistance Novel MOSFET—" Takaya, H.; Miyagi, K.; Hamada, K. Electron Devices Meeting, 2006. IEDM '06. International Publication Year: 2006, pp. 1-4.

IPCOM000199574D: "Method is Disclosed for Fabricating Laterally Diffused Metal Oxide Semiconductor (LDMOS) Device with Oxide Protection Layer Over Drift Region" Disclosed Anonymously Sep. 9, 2010.

* cited by examiner

HIGH VOLTAGE LATERALLY DIFFUSED METAL OXIDE SEMICONDUCTOR

FIELD OF THE INVENTION

The invention relates to integrated circuits and, more particularly, to high-voltage LDMOS devices with voltage linearizing field plates and methods of manufacture.

BACKGROUND

High voltage laterally diffused metal oxide semiconductor (LDMOS) transistors are used in power management, microwave and RF power amplifiers, for example. LDMOS devices use Metal-Insulator-Silicon (MIS) surfaces and back-channel field plates to assist in depletion of the drift region, allowing more charge to be placed into the drift region, and thereby reducing on-resistance and on-state power dissipation.

Planar LDMOS devices (devices without STI) can result in superior reliability performance due to the absence of field and current crowding at STI corners; however, in known conventionally fabricated planar LDMOS devices, gate-to-drain capacitance is high, compared to an STI based device. Also, there is a fundamental tradeoff between low conduction losses (on-resistance or Rsp) and switching losses (Qgg and Qgd) and off-state breakdown voltage.

Accordingly, there exists a need in the art to overcome the deficiencies and limitations described hereinabove.

SUMMARY

In an aspect of the invention, a method comprises a method comprises forming an array of poly islands and a control gate structure by patterning a poly layer formed over a deep well region and a body of a substrate. The method further comprises forming a metal shield in contact with the control gate structure and over the array of poly islands.

In an aspect of the invention, a method comprises a method comprises forming a layer of material over a deep well implant region and a well implant region. The method further comprises forming a tongue implant region within the well implant region and extending to a well region of the substrate. The method further comprises patterning the layer of material to form: a control gate in contact with a source region in the well implant region and over the deep well implant region; and discrete floating islands over the deep well implant region and the tongue implant region. The method further comprises forming a metal shield entirely covering the discrete floating islands.

In an additional aspect of the invention, a device comprises: a deep well implant region and a well implant region in a substrate; a tongue implant region within the well implant region and extending to the well region of the substrate; discrete floating islands over the deep well implant region and the tongue implant region; and a metal shield entirely covering the discrete floating islands and in contact with a control gate over the well implant region and the deep well implant region.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to high-voltage LDMOS devices with voltage linearizing field plates and methods of manufacture. In embodiments, the LDMOS devices of the present invention are planar devices with superior off-state and on-state breakdown characteristics. Advantageously, the present invention optimizes (improves) on-state (Ron) and switching (Qg) which, in turn, improves net power dissipation while improving off-state and on-state breakdown voltage. That is, the present invention improves on state and off state breakdown voltages and device reliability, while simultaneously improving ldsat and Ron and reducing Qg, total. Also, the processes of the present invention are compatible with existing processes, thus minimizing any additional fabrication costs.

In embodiments, a lateral high-voltage planar LDMOS device has a gated field plate and lightly doped drift and body implant. In embodiments, for example, a deep layer of opposite polarity as a drift implant is implanted or epitaxially grown under a drift region. A field plate layer is superimposed on top of the drift region and connected to the gate. A set of uniformly spaced resistive floating islands (e.g., array of poly islands) are formed on top of an insulator, e.g., dielectric layer, on the drift region, and a plurality of shallow diffusions of opposite polarity can be implanted in a self-aligned manner with the resistive floating islands acting as a mask. In embodiments, the uniformly spaced resistive floating islands are spaced to allow for spacer formation, which can protect the underlying semiconductor surface from being exposed to implant and etch processes, thereby ensuring that device reliability does not degrade. Also, advantageously, capacitive coupling due to the formation of the spaced resistive floating islands enables lateral voltage drop in the underlying semiconductor substrate, to be close to linear which results in optimal use of the drift region for breakdown voltage. Also, the spaced resistive floating islands will reduce gate-to-drain capacitance.

In embodiments, the spaced resistive floating islands can be made lightly doped, enabling larger voltage drops across the spaced resistive floating islands. This, in turn, results in lower fields and higher breakdown voltages. Also, in additional embodiments, the spaced resistive floating islands can be used as mask for self aligned p-type implants, thereby creating islands of p-type implants that shield corners from high-fields. This, in turn, will result in an even higher breakdown voltage.

FIGS. 1-10 show structures and respective processing steps in accordance with aspects of the present invention. It should be understood by those of skill in the art that the process of manufacturing the high-voltage LDMOS devices of the present invention can be manufactured in a number of ways using a number of different tools. In general, though, the methodologies and tools are adopted from integrated circuit (IC) technology to form the structures with certain dimensions. For example, the structures of the present invention, e.g., gate structures, patterned arrays, field plates, etc., are built on wafers and are realized in films of materials patterned by photolithographic processes. In particular, the fabrication of the structures uses three basic building blocks: (i) deposition of films of material on a substrate, (ii) applying a patterned mask on top of the films by photolithographic imaging, and (iii) etching the films selectively to the mask.

Figure 1:
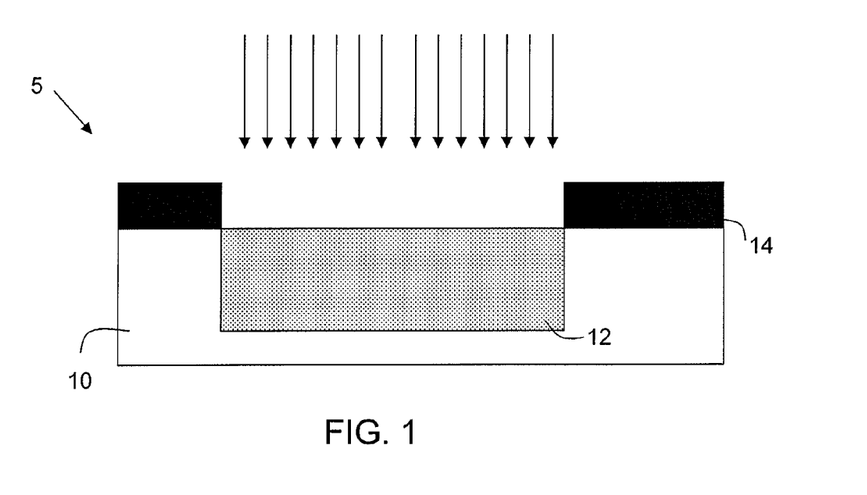
FIGS. 1-7 show structures and respective processing steps in accordance with an aspect of the present invention.

More specifically, as shown in FIG. 1, a starting structure 5 includes a substrate 10. In embodiments, the substrate 10 can be any layer of a device and more preferably an active semiconductor layer. As should be understood by those of skill in the art, the substrate 10 can be implemented in either an SOI wafer or BULK implementation, as examples. The constituent materials of the SOI wafer or BULK implementation may be selected based on the desired end use application of the semiconductor device. For example, the active semiconductor layer can be comprised of various semiconductor materials, such as, for example, Si, SiGe, SiC, SiGeC, etc. The SOI wafer may be fabricated by conventional processes including, but not limited to, oxygen implantation (e.g., SIMOX), wafer bonding, etc.

Still referring to FIG. 1, a deep well 12 is formed in the substrate 10 using conventional implantation processes. In embodiments, the deep well 12 is a deep N-well formed by implanting phosphorous into the substrate 10. In embodiments, the deep well 12 can be formed by other N-type dopants such as, for example, arsenic or antimony. In embodiments, the deep well 12 can extend very deep into the substrate. The depth can varying depending on design specification, as one of skill in the art should understand. In embodiments, the deep well 12 is defined by a resist pattern 14, which is formed by a deposition and development process known to those of skill in the art such that no further explanation is required herein for an understanding of the invention.

Figure 2:
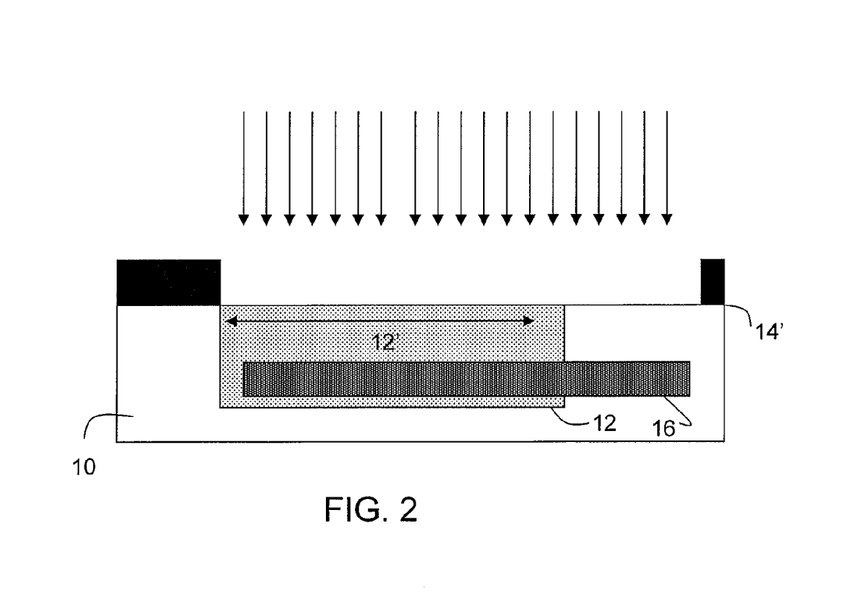

In FIG. 2, a buried tongue 16 is formed in the substrate 10, extending to within portions of the deep well 12. In embodiments, the buried tongue 16 is a P-doped implant region, formed by implanting boron into the substrate 10; although other P-type dopants are also contemplated by the present invention, e.g., Indium. In embodiments, the buried tongue 16 can be formed to a depth of about a half deep n-well; although other depths are also contemplated by the present invention. The buried tongue 16 is defined by a resist pattern 14', which is formed by a deposition and development process known to those of skill in the art such that no further explanation is required herein for an understanding of the invention. The buried tongue 16 is connected to a body well (see, e.g., FIG. 3) to provide bottom junction for additional depletion, which enables a heavier doping of a drift region 12' (e.g., lowering Ron) while maintaining off-state breakdown voltage. In embodiments, the drift region 12' can be formed by an n-doped ion implanting process, as should be known to those of skill in the art.

Figure 3:
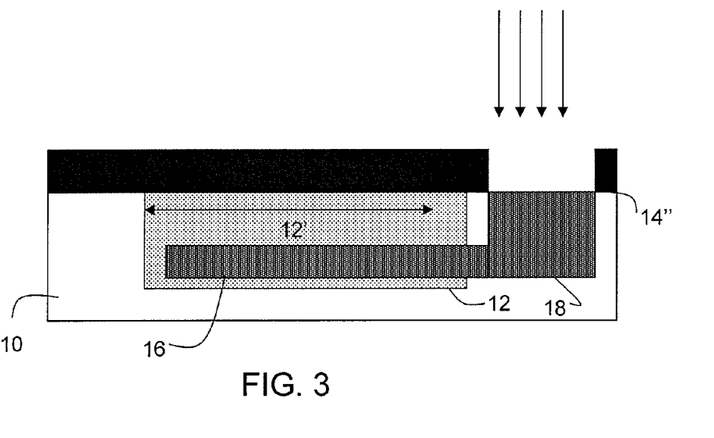

In FIG. 3, a P-well 18 is formed in the substrate 10, extending to and in contact with the buried tongue 16. As should be understood by those of skill in the art, the buried tongue 16 connected to the body well, i.e., P-well 18, will improve back-gate depletion. In embodiments, the P-well 18 is a P-doped implant region, formed by implanting boron into the substrate 10; although other P-type dopants are also contemplated by the present invention, e.g., Indium. In embodiments, the P-well 18 is defined by a resist pattern 14", which is formed by a deposition and development process known to those of skill in the art such that no further explanation is required herein for an understanding of the invention.

Figure 4:
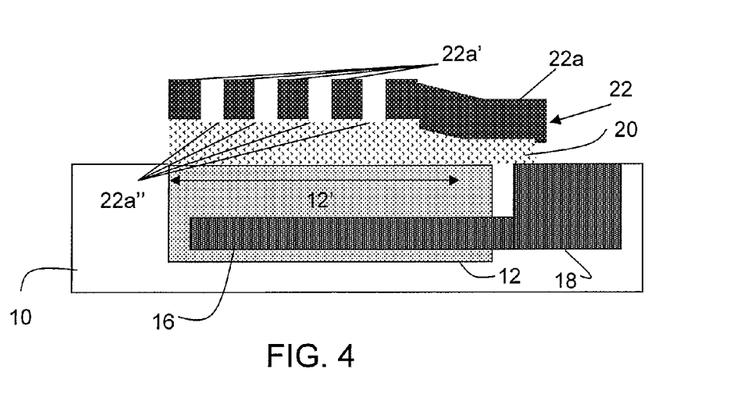

FIG. 4 shows several additional processes in accordance with aspects of the present invention. Specifically, a dielectric layer 20 is formed over the deep well 12 and extending to the P-well 18. In embodiments, the dielectric layer 20 can be any insulator layer, and is preferably an oxide layer. In embodiments, for example, the dielectric layer 20 can be $SiO_2$, $HfO_2$ or other high-k dielectric material. In further embodiments, the dielectric layer 20 can also be a nitride material.

In embodiments, the dielectric layer 20 can be formed by using conventional deposition, lithography and etching processes. For example, the dielectric layer 20 can be deposited using conventional chemical vapor deposition (CVD) processes, including for example, a plasma enhanced CVD (PECVD) process. In embodiments, the dielectric layer 20 can have any designed thickness. A resist can then be formed over the dielectric layer 20 and exposed to energy (light) to form a pattern. The dielectric layer 20 can then undergo an etching process, e.g., reactive ion etching (RIE), in order to form its final shape. In embodiments, the resist can then be stripped by an oxygen ashing process.

Still referring to FIG. 4, a poly layer 22 is deposited on the dielectric layer 20. In embodiments, the poly layer 22 can be deposited using any conventional deposition methods as described herein. In embodiments, the poly layer 22 is patterned to form a control gate 22a and an array of poly islands 22a' (discrete islands, separated from one another) over the deep well 12. The array of poly islands 22a' are floating islands (not contacting the source region), and are a discontinuous set of islands, e.g., separated by spacing or gaps 22a". In embodiments, the array of poly islands 22a' can be uniformly spaced resistive floating islands formed on top of the insulator, e.g., dielectric layer 20, over the drift region 12'. The patterning of the array of poly islands 22a' can be provided by conventional lithography and etching processes, similar to that described with respect to the patterning of the dielectric layer 20.

In embodiments, the uniformly spaced resistive floating islands 22a' are spaced to allow for spacer formation, which may be used to protect the underlying substrate surface 10 (and dielectric layer 20) from being exposed to implant and etching processes, thereby ensuring that device reliability does not degrade. In embodiments, and advantageously, capacitive coupling due to the array of poly islands 22a' enables lateral voltage drop in the underlying semiconductor substrate 10, to be close to linear which results in optimal use of the drift region 12' for breakdown voltage. Also, the array of poly islands 22a' will reduce gate-to-drain capacitance.

In more specific embodiments, the array of poly islands 22a' can have dimensions and are separated by a minimum feature, determined by technology photolithographic capability. It should be appreciated, though, that the array of poly islands 22a' can have other dimensions and be separated by other spacing, depending on design criteria of the device. For example, the spacing 22a" can be determined by the technology node of the device and, as such, the dimensions of the spacing 22a" can be technology dependent, e.g., smaller or larger. In embodiments, the buried tongue 16 will help deplete the drift region vertically from a back side which then enables the array of poly islands 22a' to set a linearizing potential across the depleted silicon.

Figure 5:
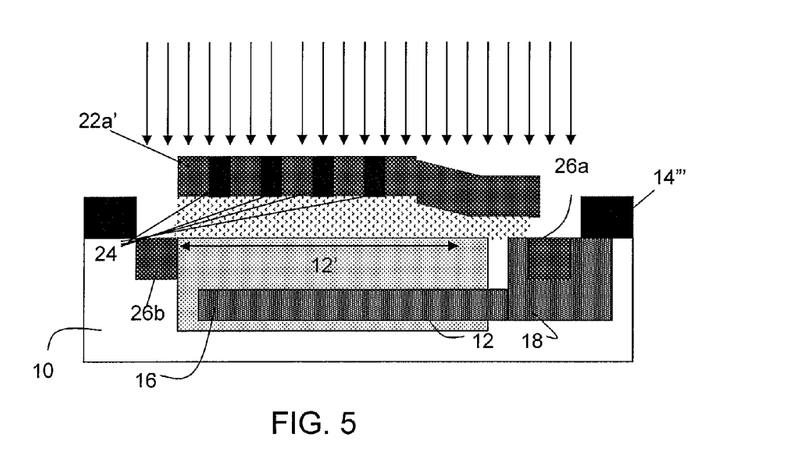

In FIG. 5, in embodiments, sidewall structures 24 can be formed on the sides of each poly island 22a' (within the spacing 22a"). In embodiments, for example, the sidewall structures 24 can be nitride or oxide, and can be formed by conventional deposition processes to partially or completely cover any exposed underlying dielectric layer 20. By way of example, to completely cover any exposed surfaces between the islands 22a'. In this way, the sidewall structures can protect the underlying dielectric layer 20 (between the separate island 22a') during subsequent processes, e.g., etching an implanting. In an alternate embodiment, the sidewall structures 24 partially cover any exposed underlying dielectric layer 20.

Still referring to FIG. 5, the structure undergoes an implantation process to form a source region 26a and a drain region 26b, as well as doping of the control gate 22a and the array of poly islands 22a'. In embodiments, the implantation process is an N-type implanting process, e.g., phosphorous, arsenic or antimony. The implantation process is similar to that described herein, in that a resist 14''' is formed to define the areas of implantation, e.g., source region 26a, drain region 26b, control gate 22a and array of poly islands 22a'. The drift region 12' is defined within the deep well 12, e.g., between a drain region 22a and a body of the device.

Figure 6:
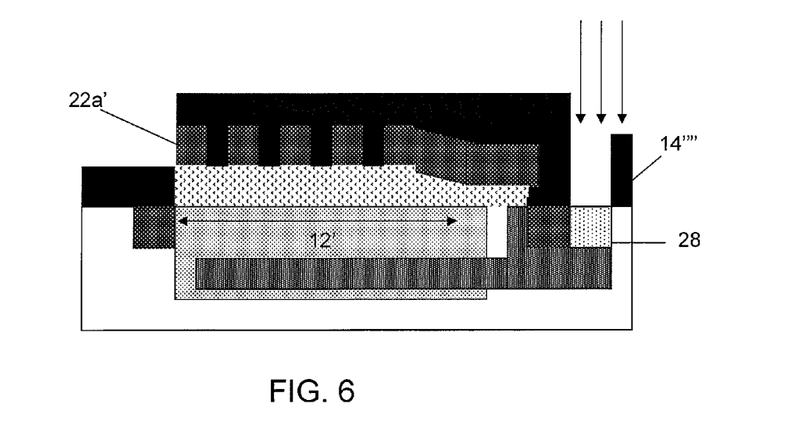

In FIG. 6, a P+ implant region 28 (body portion) is formed in the P-well 18, using conventional implantation processes. In embodiments, the P+ implant is boron or indium, for example. The P+ implant region 28 can be formed using conventional processes, as already described herein which includes the use of a blocking resist 14''''. After removal of the blocking resist, the structure undergoes a conventional silicide process on the source region 26a, drain region 26b, control gate 22a and array of poly islands 22a' in order to lower the contact resitivity of such regions 26a, 26b, 22a and 22a'.

Figure 7:
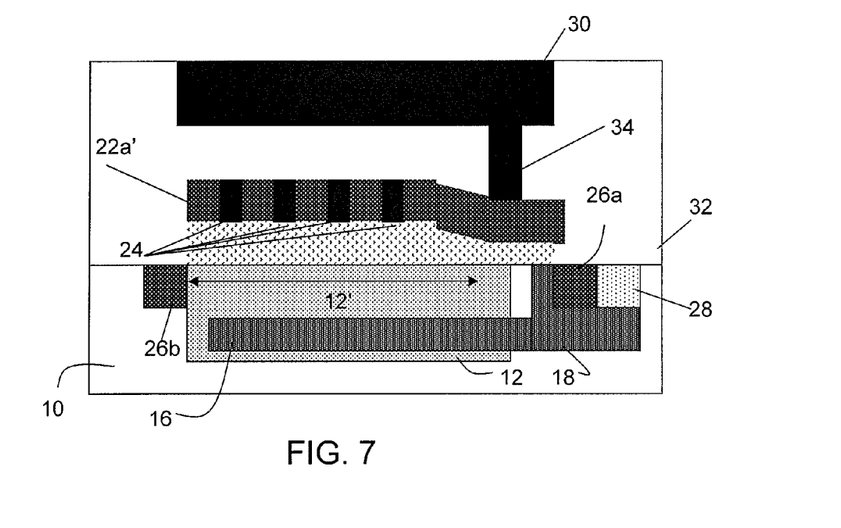

FIG. 7 shows back end of the line processes in accordance with aspects of the present invention. More specifically, FIG. 7 shows the formation of a metal wiring shield 30 in direct structural and electrical contact with the control gate 22a, using a metal via 34. In embodiments, the metal wiring shield 30 is formed over the entire array of poly islands 22a'. In this way, the metal wiring shield 30 will completely shield the array of poly islands 22a'. Accordingly, the metal wiring shield 30 will provide improved capacitive coupling connected to the gate poly and a higher K-dielectric between the metal wiring shield 30 and the array of poly islands 22a' will result in stronger coupling.

In forming the metal wiring shield 30, in embodiments, an interlevel dielectric layer 32 is deposited over the array of poly islands 22a' and the control gate 22a (and other exposed structures). The deposition process can be, for example, CVD; although, other deposition processes are contemplated by the present invention. A via is formed in the interlevel dielectric layer 32 using conventional lithography and etching processes. A metal, e.g., tungsten, copper or aluminum, is deposited in the via to form the metal via 34. The metal can be deposited in the via using conventional deposition methods including, for example, sputtering techniques, electroplating, atomic layer deposition (ALD), or other conventional deposition methods. Any residual metal can be removed using a conventional polishing process, e.g., chemical mechanical polishing (CMP). The interlevel dielectric layer 32 can also undergo a planarization process, during this polishing process.

The metal wiring shield 30 is formed by an additive or subtractive process. For example, in a subtractive process, a metal, e.g., tungsten, copper or aluminum, is deposited on the interlevel dielectric layer 32 using conventional deposition methods including, for example, CVD. A resist is formed over the metal and is patterned by exposing it to energy (light). The metal is then patterned using a conventional etching process. The resist is removed using an oxygen ashing process, following by deposition of additional interlevel dielectric material, e.g., oxide.

Figure 8:
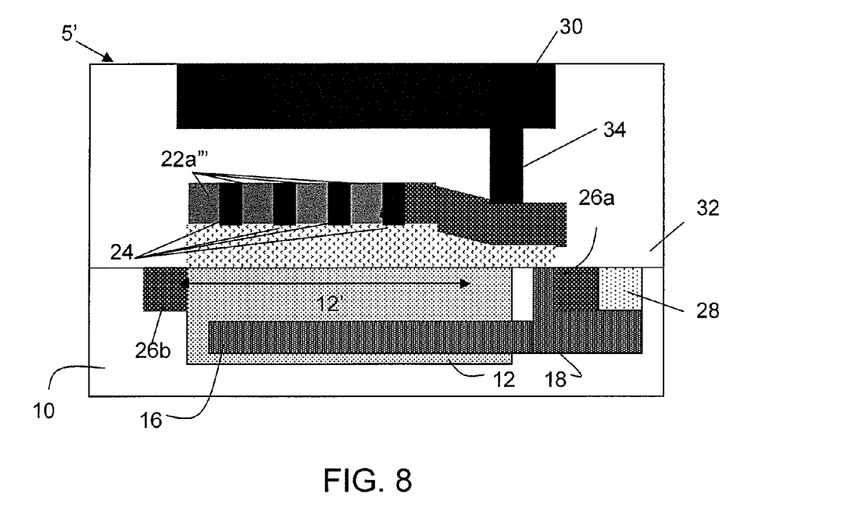
FIG. 8 shows a structure and respective processing steps in accordance with another aspect of the present invention.

FIG. 8 shows a structure and respective processing steps in accordance with another aspect of the present invention. More particular, in this structure 5' the array of poly islands 22a''' are lightly doped (N-doped) to support higher vertical electric fields and improve breakdown voltage. The array of poly islands 22a''' can be lightly doped by forming a resist over the array of poly islands during the implanting process of the source region 26a, drain region 26b, and control gate 22a, for example. Subsequent to the implanting process, the resist would be removed.

Figure 9:
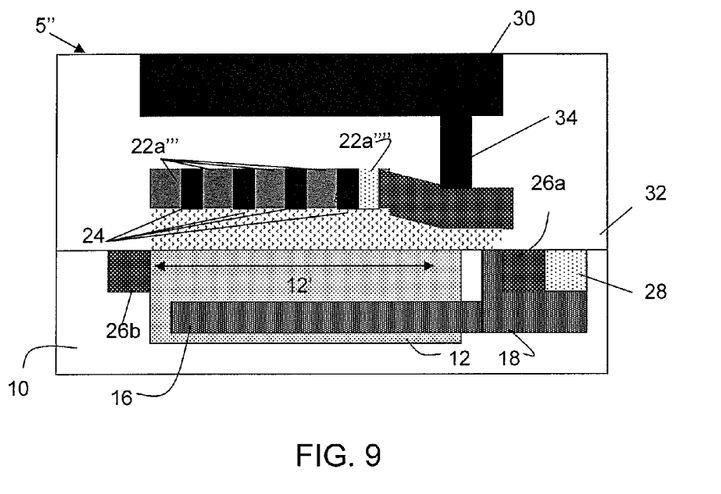
FIG. 9 shows a structure and respective processing steps in accordance with another aspect of the present invention.

FIG. 9 shows a structure and respective processing steps in accordance with another aspect of the present invention. More particular, in this structure 5'', a tip 22a'''' of the control gate 22a can be made undoped (e.g., block all source and drain implants using a resist block) or p+ doped (e.g., by a p-type implant process as described herein, using a resist block on other portions of the structure 5'') in order improve breakdown voltage. Also, in embodiments, the array of poly islands 22a''' can remain lightly doped (N-doped) to support higher vertical electric fields and improve breakdown voltage as described with respect to FIG. 8; although, it should be understood, though, that this aspect of the present invention does not require the lightly doping of the array of poly islands.

Figure 10:
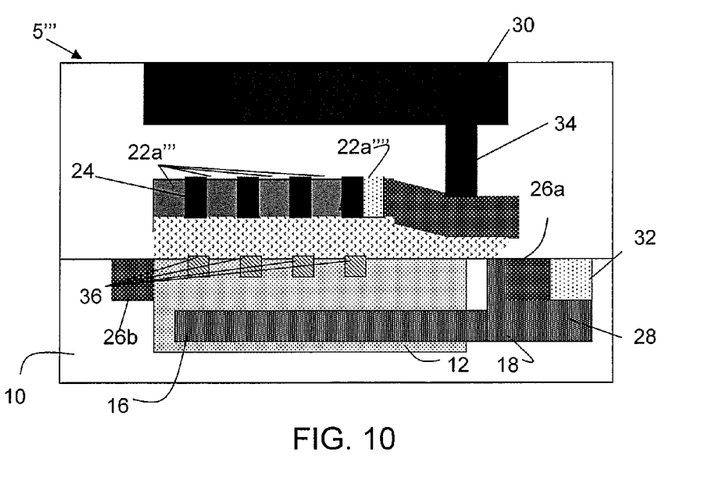
FIG. 10 shows a structure and respective processing steps in accordance with another aspect of the present invention.

FIG. 10 shows a structure and respective processing steps in accordance with another aspect of the present invention. More particular, in this structure 5''', self-aligned extension implants 36 are formed in the substrate 10 and more specifically in the deep well 12, and aligned with the spacers 24. In embodiments, the self-aligned extension implants 36 are formed prior to spacer formation, and can be formed using a p-type implant process. In embodiments, as in FIG. 9, the tip 22a'''' of the control gate 22a can be made undoped or p+ doped and the array of poly islands 22a''' can remain lightly doped (N-doped) to support higher vertical electric fields and improve breakdown voltage as described with respect to FIG. 8.

Flow Diagram

Figure 11:
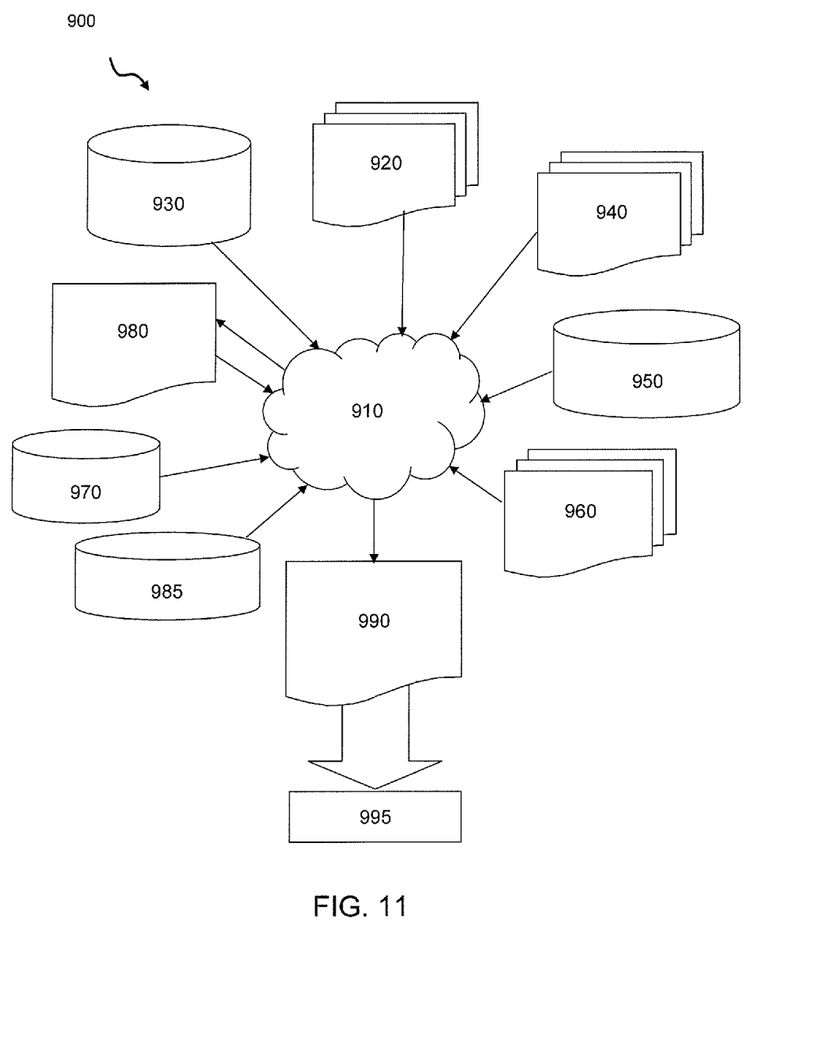
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture of the structures described herein. Design flow 900 includes processes, machines and/or mechanisms for processing design structures or devices to generate logically or otherwise functionally equivalent representations of the design structures and/or devices described above. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming an array of poly islands and a control gate structure by patterning a poly layer formed over a deep well region and a body of a substrate;
   lightly doping the array of poly islands, a source region, and a drain region, and doping the control gate structure, during a single ion implanting step; and
   forming a metal shield in contact with the control gate structure and over the array of poly islands,
   wherein a tip of the control gate structure is lightly doped.

2. The method of claim 1, wherein the array of poly islands are floating islands formed over a drift region in the deep well region, between the source region and the drain region.

3. The method of claim 1, further comprising forming an implanted tongue region within the deep well region and extending to the body, wherein the poly islands are floating islands formed over the implanted tongue region.

4. The method of claim 3, wherein the implanted tongue region enables a heavier doping of a drift region in the deep well region with respect to a remaining deep well region while maintaining an off-state breakdown voltage.

5. The method of claim 1, wherein a tip of the control gate structure is doped with a different conductive type from remaining portions of the control gate structure.

6. The method of claim 1, further comprising forming spacers on sides of each island of the array of poly islands.

7. The method of claim 6, wherein the spacers completely fill a space between each island of the array of poly islands, thereby protecting the substrate during subsequent processes.

8. The method of claim 6, wherein the spacers partially fill a space between each island of the array of poly islands.

9. The method of claim 6, further comprising forming self-aligned extension implants in the deep well region, prior to forming the spacers, and
   the self-aligned extension implants are formed using a p-type implant process.

10. A method, comprising:
    forming a layer of material over a deep well implant region and a well implant region;
    forming a tongue implant region within the well implant region and extending to a well region of a substrate;
    patterning the layer of material to form:
      a control gate in contact with a source region in the well implant region and over the deep well implant region;
      discrete floating islands over the deep well implant region and the tongue implant region;
    lightly doping the discrete floating islands, a source region, and a drain region, and doping the control gate, during a single ion implanting step; and
    forming a metal shield entirely covering the discrete floating islands,
    wherein a tip of the control gate is lightly doped.

11. The method of claim 10, wherein the discrete floating islands are formed between the metal shield and the tongue implant region and are comprises of a poly material.

12. The method of claim 10, wherein the tip of the control gate structure remains lightly doped with an opposite dopant than the discrete floating islands.

13. The method of claim 10, further comprising forming spacers on sides of each island of the discrete floating islands.

14. The method of claim 13, further comprising forming self-aligned extension implants in the deep well region, prior to forming the spacers; and
    the self-aligned extension implants are formed using a p-type implant process.

15. A device, comprising:
    a deep well implant region and a well implant region in a substrate;
    a tongue implant region within the deep well implant region and extending to the well implant region of the substrate;
    discrete floating islands over the deep well implant region and the tongue implant region; and
    a metal shield entirely covering the discrete floating islands and in contact with a control gate over the well implant region and the deep well implant region,
    wherein the discrete floating islands, a source region, and a drain region are lightly doped and formed during a single ion implanting step, and the control gate is also doped and formed during the single ion implanting step, and
    wherein a tip of the control gate is lightly doped.

* * * * *